(12) United States Patent
Meng et al.

(10) Patent No.: US 11,908,658 B2
(45) Date of Patent: Feb. 20, 2024

(54) SCANNING ELECTRON MICROSCOPE DEVICE AND ELECTRON BEAM INSPECTION APPARATUS

(71) Applicant: Zhongke Jingyuan Electron Limited, Beijing (CN), Beijing (CN)

(72) Inventors: Qinglang Meng, Beijing (CN); Weiqiang Sun, Beijing (CN)

(73) Assignee: Zhongke Jingyuan Electron Limited, Beijing (CN)

( * ) Notice: Subject to any disclaimer, the term of this patent is extended or adjusted under 35 U.S.C. 154(b) by 0 days.

(21) Appl. No.: 17/645,859

(22) Filed: Dec. 23, 2021

(65) Prior Publication Data

US 2023/0005709 A1 Jan. 5, 2023

(30) Foreign Application Priority Data

Jul. 1, 2021 (CN) .......................... 202110746459.6

(51) Int. Cl.
*H01J 37/28* (2006.01)
*H01J 37/09* (2006.01)
(Continued)

(52) U.S. Cl.
CPC .............. *H01J 37/28* (2013.01); *H01J 37/09* (2013.01); *H01J 37/141* (2013.01); *H01J 37/147* (2013.01); *H01J 37/244* (2013.01)

(58) Field of Classification Search
CPC .......... H01J 37/28; H01J 37/09; H01J 37/141; H01J 37/147; H01J 37/244; H01J 37/153;
(Continued)

(56) References Cited

U.S. PATENT DOCUMENTS

| 8,183,526 B1* | 5/2012 | Mankos | ................. | H01J 37/05 250/305 |
| 11,195,688 B2* | 12/2021 | Jiang | ...................... | H01J 37/16 |

(Continued)

*Primary Examiner* — David A Vanore
(74) *Attorney, Agent, or Firm* — Benesch, Friedlander, Coplan & Aronoff, LLP

(57) ABSTRACT

A scanning electron microscope device for a sample to be detected and an electron beam inspection apparatus are provided, the scanning electron microscope device being configured to project electron beam to a surface of the sample to generate backscattered electrons and secondary electrons, and comprising: an electron beam source, a deflection mechanism, and an objective lens assembly. The deflection mechanism comprises a first deflector located downstream the electron beam source and a second deflector located downstream the first deflector. The objective lens assembly comprises: an excitation coil; and a magnetic yoke, formed by a magnetizer material as a housing which opens towards the sample and comprising a hollow body defining an internal chamber where the excitation coil is accommodated, and at least one inclined portion extending inward from the hollow body at an angle with reference to the hollow body and directing towards the optical axis, with an end of the at least one inclined portion being formed into a pole piece. The deflection mechanism further comprises a third deflector located between the second deflector and the objective lens assembly and disposed in an opening delimited and circumscribed by the pole piece, and each of the first deflector, the second deflector and the third deflector is an electrostatic deflector.

16 Claims, 3 Drawing Sheets

(51) Int. Cl.
*H01J 37/141* (2006.01)
*H01J 37/147* (2006.01)
*H01J 37/244* (2006.01)

(58) Field of Classification Search
CPC ............ H01J 37/145; H01J 2237/1035; H01J 2237/1405; H01J 2237/1534; H01J 2237/28; H01J 2237/2817; H01J 37/06; H01J 37/1477
See application file for complete search history.

(56) References Cited

U.S. PATENT DOCUMENTS

| | | | |
|---|---|---|---|
| 11,239,044 B2* | 2/2022 | Meng | H01J 37/1471 |
| 11,295,928 B2* | 4/2022 | Meng | H01J 37/244 |
| 2002/0054703 A1* | 5/2002 | Hiroi | G06T 7/001 |
| | | | 382/149 |
| 2002/0185599 A1* | 12/2002 | Kimura | H01J 37/244 |
| | | | 250/310 |
| 2003/0209667 A1* | 11/2003 | Petrov | G01N 23/22 |
| | | | 250/310 |
| 2004/0056207 A1* | 3/2004 | Petrov | H01J 37/1475 |
| | | | 250/396 ML |
| 2005/0263715 A1* | 12/2005 | Nakasuji | H01J 37/141 |
| | | | 250/311 |
| 2006/0134810 A1* | 6/2006 | Bullock | G01N 23/20 |
| | | | 438/5 |
| 2016/0172150 A1* | 6/2016 | Li | H01J 37/145 |
| | | | 250/396 ML |
| 2016/0217968 A1* | 7/2016 | Li | H01J 37/1472 |
| 2016/0260579 A1* | 9/2016 | Luo | H01J 37/28 |
| 2019/0341224 A1* | 11/2019 | Hempenius | H01J 37/09 |

* cited by examiner

SCANNING ELECTRON MICROSCOPE DEVICE AND ELECTRON BEAM INSPECTION APPARATUS

CROSS-REFERENCE TO RELATED APPLICATION

The present disclosure claims the benefit of Chinese Patent Application Invention No. 202110746459.6 filed on Jul. 1, 2021 in the China National Intellectual Property Administration, the whole disclosure of which is incorporated herein by reference.

BACKGROUND

Field

Embodiments of the present disclosure generally relate to the technical field of scanning electron microscope, and more particularly to a scanning electron microscope device and an electron beam inspection apparatus.

Description of Relevant Art

In semiconductor manufacturing processes, microchip(s) or integrated circuit (ICs) can be manufactured on a wafer. Processes of manufacturing IC involve several stages, comprising, for example, a design stage, a manufacturing stage and an inspection stage. The design stage involves designing both structure and arrangement of circuit components for IC. The manufacturing stage may comprise a plurality of operations, such as lithography, etching, deposition, chemical mechanical planarization (CMP), and the like. During the manufacturing stage, in a "patterning" process thereof, geometric features (e.g., patterns) on a mask or a reticle may be transferred to a surface of the wafer. A wafer formed with geometric features thus transferred may be referred to as a "patterned wafer". In the inspection stage, the IC thus manufactured can be inspected for quality control.

Defects may be incurred during the manufacturing stage. For example, the surface of the wafer may be provided with defects, or the mask may be provided with defects that can be further transferred to the wafer. Therefore, it is advantageous to check for potential defects in the wafer and/or the mask (e.g., in appropriate processing operations) during the inspection stage. Results of the inspection may be used to improve or adjust the design stage, the manufacturing stage, the inspection stage or any combination thereof. In general, "patterned substrate" (or abbreviated as "substrate" in the context, without introducing any confusion herein) may be used to represent a wafer, a mask, a reticle, or any structure having a pattern thereon. As semiconductor devices becomes more and more miniaturized in recent years, detection and critical dimension measurement for objects such as substrates (e.g., wafers, or masks, or reticles) become increasingly important.

In the field of electron beam inspection (EBI) for semiconductors, both detection speed and throughput are very demanding, and size of available field of view (FOV) of a single frame scanning image determines maximum detection efficiency of the apparatus. As it is expected to achieve components of smaller size in IC manufacturing process so as to achieve higher performance density, then, it becomes a challenge in semiconductor manufacturing to detect defects of relatively small size. Imaging techniques are typically used to inspect defects on patterned substrates. When design rules are reduced (e.g., below 20 nm), high-throughput inspection system (e.g., optical inspection system) may face the challenge of insufficient sensitivity for finding defects (e.g., physical defects). In addition, the optical inspection system may not be able to detect electrical defects buried below the surface.

Therefore, a high-resolution inspection systems, e.g., an electron beam inspection (EBI) system or a charged particle beam imaging system, becomes more and more important in defect detection, especially for electrical defects and minor physical defects. Electron beam inspection apparatus is typically used for defect detection in the production process of semiconductor devices, and its main principle is to bombard the surface of the sample which is being detected with high-energy electron beam, detect both secondary electrons (SE) and backscattered electrons (BSE) generated in a bombarded area of the surface of the sample which area is bombarded, and obtain various physical and chemical information of the sample itself which is being detected, such as topology, composition thereof, etc. Applications of electron beam detection device are typically, for example, based on detection and critical dimension measurement of microscopic patterns on semiconductor silicon wafer and mask with electron beam in vacuum. Electron beam inspection apparatus (comprising scanning electron microscope and the like) is typically used in application scenarios such as semiconductor silicon wafer pattern defect detection with electron beam, and the like. As such, with continuous refinement of semiconductor processes, optical inspection has gradually been unable to meet the detection requirements, and electron beam inspection has been applied more and more widely.

However, electron beam inspection also has inherent defects, for example, it has a relatively narrow field of view, and thus it takes more time to inspect samples having the same area, resulting in relatively low throughput of semiconductor detection with electron beam, which limits its popularity for on-line process monitoring and mass manufacturing in semiconductor processes. Further, by way of example, an electromagnetic lens is typically as an objective lens arranged behind or after an electron beam deflection mechanism; Specifically, in a typical electron beam inspection apparatus, e.g., a scanning electron microscope (SEM), there are two deflectors provided in the electron beam deflection mechanism, i.e., a first deflector which is configured to deflect the electron beam emitted from an electron beam source in an off-axis way, and a second deflector which is located downstream the first deflector deflects the electron beam back towards a paraxial position, such that the electron beam thus deflected then travels to the objective lens and focuses to image near a pole piece of the objective lens. With the assistance of the deflector, a movement of positioning and scanning the electron beam thus generated on the sample to be detected can be used to generate and acquire secondary electrons or backscattered electrons from the sample, and then used to generate the sample image. The image obtained by such a typical scanning way is subject to a fact that an off-axis aberration of the electron beam incident on the surface of the sample to be detected is relatively large, such that its available field of view is relatively small, which affects the operation efficiency of the electron beam inspection apparatus.

Therefore, in a relevant technical field, it is required urgently to obtain improved scanning electron microscope device and electron beam inspection apparatus, which can reduce off-axis aberration of the electron beam incident thereon, ensure an even larger available field of view of scanning image produced by the electron beam, thus enhancing operational efficiency of the inspection apparatus.

SUMMARY

The embodiments of the present disclosure have been made to overcome or alleviate at least one aspect of the above mentioned disadvantages and/or shortcomings in the prior art, by providing a scanning electron microscope device and an electron beam inspection apparatus.

In order to achieve above objectives, following technical solutions are adopted in exemplary embodiments of the invention.

According to one aspect of embodiments of the disclosure, there is provided a scanning electron microscope device for a sample to be detected, the scanning electron microscope device being configured to project electron beam to a surface of the sample to generate backscattered electrons and secondary electrons, and comprising: an electron beam source, a deflection mechanism, and an objective lens assembly. The deflection mechanism comprises a first deflector located downstream the electron beam source and a second deflector located downstream the first deflector. The objective lens assembly comprises: an excitation coil; and a magnetic yoke, formed by a magnetizer material as a housing which opens towards the sample and comprising a hollow body in the form of closed ring shape and defining an internal chamber where the excitation coil is accommodated, and at least one inclined portion extending circumferentially inward from the hollow body at an angle with reference to the hollow body and directing towards the optical axis, with an end of the at least one inclined portion being formed into a pole piece. The deflection mechanism further comprises a third deflector located between the second deflector and the objective lens assembly and disposed in an opening delimited and circumscribed by the pole piece, and each of the first deflector, the second deflector and the third deflector is an electrostatic deflector.

According to exemplary embodiments of the present disclosure, each of the first deflector, the second deflector and the third deflector comprises a pair of electrodes provided opposite to each other and symmetrically relative to the optical axis, and is applied with respective electric excitation which is adjustable so as to adjust both direction and angle of the electron beam passing through the scanning electron microscope device.

According to exemplary embodiments of the present disclosure, each of the first deflector, the second deflector and the third deflector is in the form of 8-pole or 12-pole electrostatic deflector, and is applied with respective electric excitation which is adjustable so as to adjust both direction and angle of the electron beam passing through the scanning electron microscope device.

According to exemplary embodiments of the present disclosure, the pole piece is an end of the inclined portion of the magnetic yoke substantially parallel to the optical axis, and a length of each electrode of the third deflector is of the same order of magnitude as a thickness of the pole piece but is not smaller than and is preferably equal to the thickness of the pole piece.

According to exemplary embodiments of the present disclosure, the first deflector, the second deflector and the third deflector are arranged coaxially with each other or one another along the optical axis.

According to exemplary embodiments of the present disclosure, electrodes of the third deflector are arranged at a predetermined angle relative to electrodes of the first deflector, and the predetermined angle is set such that an off-axis aberration of the electron beam which is subject to deflection applied by the third deflector is minimized.

According to exemplary embodiments of the present disclosure, the third deflector is formed by a non-magnetizer material which is electrically conductive.

According to exemplary embodiments of the present disclosure, the inclined portion of the objective lens assembly defines an electron beam channel shrinking towards the sample, with a portion of the electron beam channel at the third deflector being a gap defined between the electrodes of the third deflector in a diameter direction thereof.

According to exemplary embodiments of the present disclosure, the scanning electron microscope device further comprises a shielding plate provided below the third deflector, with an orthographic projection of the third deflector on a plane perpendicular to the optical axis completely falling in an orthographic projection of the shielding plate on the plane perpendicular to the optical axis.

According to exemplary embodiments of the present disclosure, the shielding plate is made by metallic material, with an adjustable voltage applied thereon.

According to another aspect of embodiments of the disclosure, there is provided an electron beam inspection apparatus, comprising: the scanning electron microscope device as above; a first detector located downstream the sample and configured to detect backscattered electrons generated by the electron beam incident on the surface of the sample; and a second detector located downstream of the sample and configured to detect secondary electrons generated by the electron beam incident on the surface of the sample.

BRIEF DESCRIPTION OF THE DRAWINGS

Embodiments of the present disclosure will now be described, merely by way of example, with reference to the accompanying schematic drawings, in which the corresponding reference numerals represent the corresponding components. A brief description of the drawings is as follows.

DETAILED DESCRIPTION OF EMBODIMENTS

Figure 1:
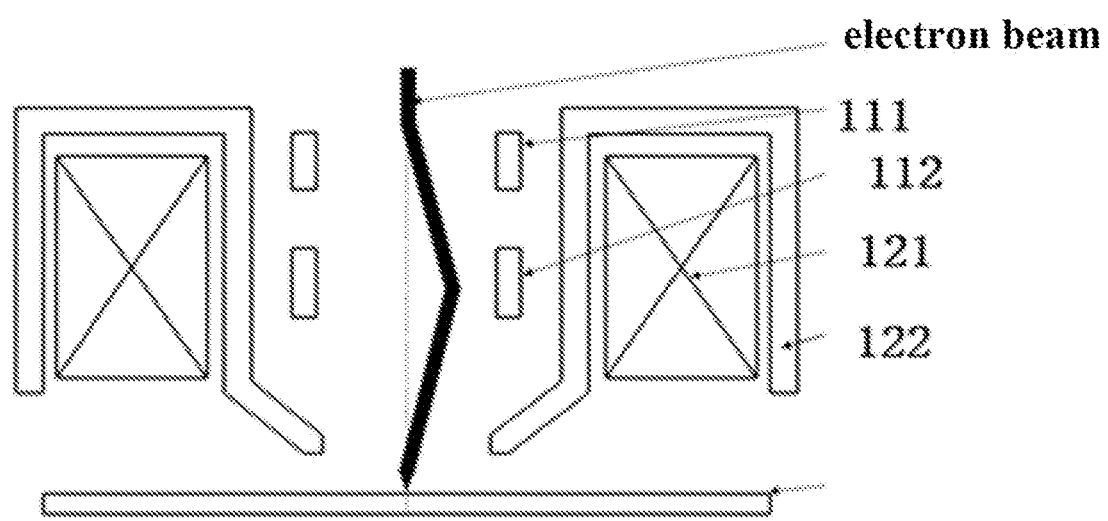
FIG. 1 is a schematic structural view illustrating a scanning electron microscope device in relevant art.

Technical solution of the present disclosure will be further explained in detail through the embodiments in combination with the accompanying drawings. In the specification, same or similar reference numerals and alphabets indicate same or similar components. Following description of the embodiments of the present disclosure with reference to the accompanying drawings is intended to explain overall inventive concept of the present disclosure, rather than a limitation of the present disclosure.

The accompanying drawings are used to illustrate the contents of embodiments of the present disclosure. Dimensions and shapes of the components in the drawings do not demonstrate true scales of components of a scanning electron microscope device and an electron beam inspection apparatus.

In embodiments of the present disclosure, expression "downstream" refers to a direction in or along a travel direction of the electron beam emitted from an electron source, and expression "upstream" refers to a direction opposite to the travel direction of the electron beam emitted from the electron source.

Moreover, in embodiments of the present disclosure, expressions "radial direction", "diameter direction" and "axial direction" all take a direction of an optical axis O of an electron beam source 10 as a reference.

Figure 2A:
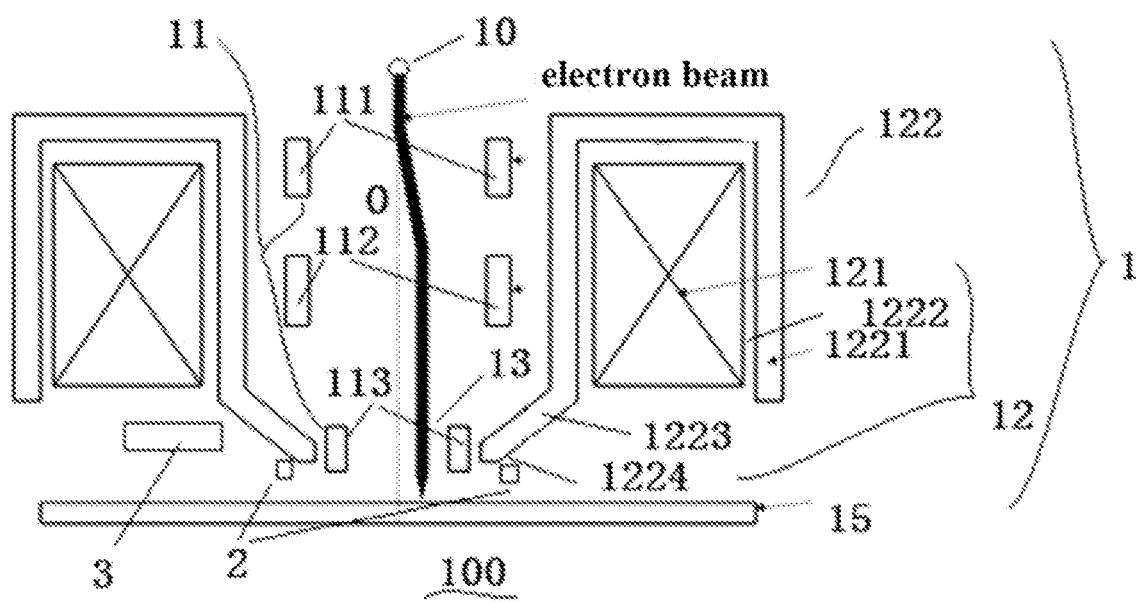
FIG. 2A is a schematic structural view illustrating a scanning electron microscope device according to embodiments of the present disclosure and an exemplary electron beam inspection apparatus comprising the scanning electron microscope device.

FIG. 1 is a schematic structural view illustrating a scanning electron microscope device 1 in relevant art. FIG. 2A is a schematic structural view illustrating a scanning electron microscope device 1 according to embodiments of the present disclosure According to a general technical concept of the present disclosure, as illustrated in FIG. 2A, in a first aspect of embodiments of the present disclosure, there is provided a scanning electron microscope device 1 for a sample 15 to be detected, which is configured to project electron beam to a surface of the sample 15 to generate backscattered electrons and secondary electrons for detection on properties of the sample 15, the scanning electron microscope device 1 at least comprising an electron beam source 10, a deflection mechanism 11 for the electron beam located downstream the electron beam source 10, and an objective lens assembly 12 located downstream the deflection mechanism 11. By way of example, the electron beam source 10 is configured to emit an electron beam along an optical axis O of the electron beam source 10. In exemplary embodiments, specifically, the electron beam source 10 is, for example, a hot electron emitter, a cold field emitter, or a hot electron field emitter (e.g., a Schottky emitter). The electron beam source 10 comprises, for example, a single emitter or a plurality of emitters of any one type of above types of electron emitters. For example, the deflection mechanism 11 comprises at least: a first deflector 111 located downstream the electron beam source 10; and a second deflector 112 located downstream the first deflector 111. And, by way of example, the objective lens assembly 12 comprises an excitation coil 121 which is energized to create a magnetic field and a magnetic yoke 122 which is for example a housing formed by a magnetizer material to open towards the sample 15. And the magnetic yoke 122 further comprises: a hollow body 1221 which is for example in the form of closed ring shape and defines an internal chamber 1222; and at least one inclined portion which extends (e.g., at whole circumference thereof) inward from the hollow body 1221 (e.g., at an angle with reference to the hollow body) and directing towards the optical axis O. For example, as illustrated, the at least one inclined portion comprises an inclined portion 1223 extending inward toward the optical axis O from a radial inner wall of the hollow body 1221 at an angle (and in turn, for example, at an angle with reference to the optical axis O), with an end of the at least one inclined portion (e.g., the inclined portion 1223) being formed as a pole piece 1224, the excitation coil 121 being accommodated in the internal chamber 1222. As such, the pole piece 1224 opens in a direction essentially directing towards the sample 15 to be detected.

By way of example, the magnetizer material forming the magnetic yoke 122 is, for example, a soft magnetic material, e.g., a ferromagnetic material, preferably iron, ferroalloy, or any other relatively material having relatively high magnetic permeability and thus used to provide a magnetic path of relatively low magnetic reluctance for the magnetic field established by the excitation coil. As such, magnetic field lines between opposite portions of the pole piece 1224 (i.e., portions of the pole piece 1224 arranged opposite to each other, e.g., diametrically opposite to each other) result in a completed magnetic circuit; and since the pole piece 1224 opens in a direction essentially directing towards the sample 15 to be detected, then the sample 15 to be detected is considered to be immersed in the magnetic field of the magnetic lens thus formed. In other words, the objective lens assembly 12 is essentially an immersed type magnetic lens excited by a current coil; for example, metal wire can be wound into an excitation coil thereof (i.e., the current coil), and the magnetic yoke 122 functioning as the housing which is formed for example by ferromagnetic material is located outside the excitation coil, and the pole piece 1224 of the magnetic lens is located at the opening of the magnetic yoke 122 (i.e., the housing), such that the sample 15 to be detected (for example, the surface thereof), is immersed in the magnetic field of the magnetic lens.

Moreover, in embodiments of the present disclosure, the deflection mechanism 11 further comprises a third deflector 113 located between the second deflector 112 and the objective lens assembly 12 and disposed in an opening delimited and circumscribed by the pole piece 1224. By way of example, each of the first deflector 111, the second deflector 112 and the third deflector 113 is an electrostatic deflector.

Figure 2B:
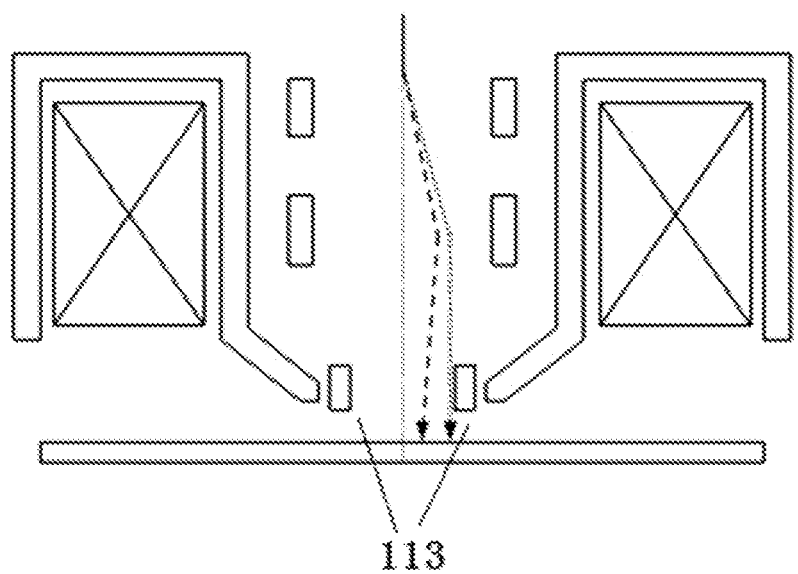
FIG. 2B illustrates a schematic trajectory of electron beam of the scanning electron microscope as illustrated in FIG. 2A.

FIG. 2B illustrates a schematic trajectory of electron beam of the scanning electron microscope as illustrated in FIG. 2A.

With above settings, for example, as illustrated in FIG. 2B, fine and dense dotted line illustrate a travelling path of the electron beam in a condition of merely two deflectors without a third deflector, and sparse dotted line having thick spacing among dots illustrate another travelling path of the electron beam in a condition of three deflectors (i.e., having the third deflector in addition to the first deflector and the second deflector). A propagation direction of the electron beam in which the electron beam propagates/travels from the electron beam source 10 is deflected after the electron beam passes through the first deflector 111; And then, after the electron beam further passes through the second deflector 112, the propagation direction of the electron beam is further subject to a reverse deflection back towards the optical axis O, applied by the second deflector, as compared with the deflection effect of the first deflector; and next, the electron beam passes through a synthetic/combined electromagnetic field formed by both the objective lens and the third deflector 113, and finally the electron beam is focused on the surface of the sample.

With above settings, in the deflection mechanism 11 in embodiments of the present disclosure, three electrostatic deflectors are adopted to function as the first deflector, the second deflector and the third deflector, respectively, wherein the first deflector 111 is used to deviate the propagation direction of the electron beam away from the optical axis O, and the second deflector 112 further deflects the propagation direction of the electron beam reversely. A purpose of providing the two deflectors is to change the propagation direction of the electron beam in which it travels. Moreover, by way of example, the third deflector 113 is installed at center(s) of magnetic field and/or electric field of the objective lens assembly 12, and an off-axis aberration of off-axis electron beam is reduced with a distribution of electrostatic field, so as to improve size of an available field of view (FOV). A solution of embodiments of the present disclosure is mainly directed towards a technical field of semiconductor defect detection with electron beam.

By way of example, the first deflector 111, the second deflector 112 and the third deflector 113 are arranged coaxially with each other or one another along the optical axis O.

Moreover, in embodiments of the present disclosure, each of the first deflector 111, the second deflector 112 and the third deflector 113 of the deflection mechanism 11 comprises at least a pair of electrodes provided opposite to each other and symmetrically relative to the optical axis O, and is applied with respective electric excitation which is adjustable so as to adjust both direction and angle of the electron beam passing through the scanning electron microscope device.

More specifically, voltage excitations among the third deflector 113, and the first deflector 111 and the second deflector 112 may be proportional. If different voltage ratios are adopted, then resolutions of scanning images of the electron beam may vary (i.e., resolutions of scanning images are different). Magnitudes of respective electric excitations of the three deflectors are adjusted depending on different acceleration energies as required respectively, so as to ensure a maximum available field of view of the image generated by the electron beam.

In a more specific embodiment, by way of example, each of the first deflector 111, the second deflector 112 and the third deflector 113 comprises a pair of electrodes provided opposite to each other and symmetrically relative to the optical axis O, and is applied with respective electric excitation which is adjustable so as to adjust both direction and angle of the electron beam passing through the scanning electron microscope device.

In an alternative more specific embodiment, for example, each of the first deflector 111, the second deflector 112 and the third deflector 113 is a multi-pole type electrostatic deflector for example comprising four, six, eight, ten, twelve or any even number of poles. Each multi-pole type electrostatic deflector may be "excited" with different voltages or currents to control a parameter referred to as "excitation intensity". The excitation intensity represents a capacity of extending or restraining a cross section of the electron beam (such cross section may be referred to as "beam spot"). In the present disclosure, "excitation" refers to a process of generating deflection fields by applying voltages respectively. Typically, the multi-pole type electrostatic deflector is for example in the form of 8-pole or 12-pole electrostatic deflector, and is applied with respective electric excitation which is adjustable so as to adjust both direction and angle of the electron beam passing through the scanning electron microscope device. Specifically, an electrostatic deflector in the form of either 8-pole or 12-pole electrostatic deflector may be used to reduce the off-axis aberration of the electron beam, with a difference therebetween lying in that: 8-pole electrostatic deflector requires a relatively complex electronic control module, but it is relatively easy to process and to ensure the processing accuracy therefore; while an electric control module of 12-pole electrostatic deflector is relatively simple, but the processing thereof is relatively cumbersome and thus is not easy to ensure the accuracy.

Both direction and angle of the electron beam are adjustable upon passing through the three deflectors, by changing magnitudes of respective excitations of the three deflectors. The electron beam passing through the second deflector 112 may enter the third deflector 113 in a direction parallel to the optical axis O, or may enter the third deflector 113 at a small angle (e.g., less than 30 degree angle, preferably less than 10 degree angle) relative to the optical axis O, as illustrated in FIG. 2B.

Table 1 is a list of comparisons of imaging effects of the electron beam between the scanning electron microscope device 1 of embodiments of the present disclosure as illustrated in FIG. 2A and the scanning electron microscope device 1 in relevant art as illustrated in FIG. 1.

TABLE 1

| | 100 um FOV | | 150 um FOV | | 2000 um FOV | |
| --- | --- | --- | --- | --- | --- | --- |
| | dual deflectors | triple deflectors (8-pole) | dual deflectors | triple deflectors (8-pole) | dual deflectors | triple deflectors (8-pole) |
| spherical aberration (um) | 0.00031 | 0.00027 | 0.00031 | 0.00027 | 0.00031 | 0.00027 |
| chromatic aberration (um) | 0.00598 | 0.00422 | 0.00772 | 0.00512 | 0.00954 | 0.00617 |
| coma (um) | 0.00029 | 0.00038 | 0.00044 | 0.00057 | 0.00059 | 0.00076 |
| astigmatism (um) | 0.00105 | 0.00453 | 0.00236 | 0.0102 | 0.00419 | 0.01814 |
| field curvature (um) | 0.01558 | 0.00719 | 0.03505 | 0.01617 | 0.06231 | 0.02875 |
| distortion (um) | 0.2462 | 0.02816 | 0.83091 | 0.095 | 1.9695 | 0.25531 |
| on-axis beam spot (nm) | 6.43 | 6.052 | 6.43 | 6.052 | 6.43 | 6.052 |
| off-axis beam spot (nm) | 16.73 | 9.5 | 35.97 | 19.81 | 63.2 | 34.56 |

With above settings, as compared with the scanning electron microscope device 1 in relevant art as illustrated in FIG. 1, in the scanning electron microscope of embodiments of the present disclosure as illustrated in FIG. 2A, that is, the third deflector 113 is additionally provided at or in proximity of the pole piece 1224 of the objective lens assembly 12, and is used cooperatively with the first deflector 111 and the second deflector 112 both located upstream the objective lens assembly 12, with a function to reduce the off-axis aberration of the electron beam by using the electrostatic field generated by the third deflector 113.

Specifically, simulation results as illustrated in Table 1 are obtained by using the electronic optical simulation software MeBS to implement analysis. As illustrated in the list in Table 1, in essence, comparison of geometric aberrations, in case of three fields of view of 100 μm, 150 μm, and 200 μm, between respective scanning electron microscope devices in the relevant art and in embodiments of the disclosure. Specifically, upon consideration of definition of geometric aberration in the art, then on-axis aberration mainly comprises following items, that is, monochromatic aberration thereof for a monochromatic light (i.e., specifically functioning as monochromatic aberration from on-axis point, comprising spherical aberration) and position chromatic aberration for chromatic light having different wavelengths (functioning as chromatic aberration from on-axis point), both of which constitute aberration from on-axis point; and off-axis aberration mainly comprises the following items, that is, monochromatic aberration thereof (i.e., specifically functioning as monochromatic aberration from off-axis point, comprising coma, astigmatism, field curvature, and distortion) and magnification chromatic aberration (functioning as chromatic aberration from off-axis point), both of which constitute aberration from off-axis point, then, in embodiments of the present disclosure, the off-axis aberration of the electron beam mainly refers to off-axis chromatic aberration, astigmatism, field curvature and distortion, in which the distortion affects orthogonality of the image rather than affecting the resolution of the image. Thereby, as compared with a condition containing merely two deflectors in relevant art, then, in embodiments of the present disclosure, due to the addition of the third deflector 113, off-axis chromatic aberration, field curvature and distortion (especially the latter two, i.e., field curvature and distortion) of the electron beam will be significantly decreased, without affecting size of the beam spot on the axis, simultaneously. As such, the available field of view of the scanning images of the electron beam may be expanded and detection efficiency of the electron beam may be improved.

Moreover, by way of example, as illustrated in Table 1, it can be seen that in a condition of the deflection mechanism in the form of dual deflector type in relevant art, then, as to a field of view of 100 μm, the off-axis beam spot is 16.73 nm, however, the off-axis beam spot may be decreased to 9.5 nm (e., with a drop percentage or decreasing amplitude percentage up to 43%) in the existence of additional third deflector 113. Furthermore, as to a field of view of 150 μm, the off-axis beam spot may be decreased with a drop percentage or decreasing amplitude percentage of 45% in the existence of additional third deflector 113; and as to a field of view of 200 μm, the off-axis beam spot may be decreased with a drop percentage or decreasing amplitude percentage of 45.3% in the existence of additional third deflector 113. A main factor resulting in reduction of the off-axis beam spot lies in that, off-axis chromatic aberration, field curvature and distortion all become smaller; and although both astigmatism and coma become larger, their respective contributions to the size of the electron beam spot are relatively small. In general, the electron beam spot becomes smaller in the existence of additional third deflector 113.

Therefore, an incident angle of the electron beam entering the objective lens assembly 12 may be controlled by changing the deflection excitation of the second deflector 112, and then, the maximum available field of view of the electron beam image may be ensured, by changing the excitation of the third deflector 113, which fact expands service conditions of the deflector.

In exemplary embodiments of the present disclosure, specifically, for example, the hollow body 1221 is an annular hollow body 1221 defining the internal chamber 1222 in a form of annular shape for accommodating the excitation coil 121 therein.

And, as illustrated in FIG. 2A, specifically, for example, the inclined portion 1223 is in a form of a conical ring shrinking towards the sample.

In exemplary embodiments of the present disclosure, for example, the inclined portion 1223 of the objective lens assembly 12 defines an electron beam channel 13 shrinking towards the sample 15, with a portion of the electron beam channel 13 at the third deflector 113 being a gap defined between the electrodes of the third deflector 113 in a diameter direction thereof.

Moreover, installation position, size and installation angle of the third deflector 113 additionally provided in the opening of the pole piece 1224 of the objective lens assembly 12 have great influence on the off-axis aberration of the electron beam propagating therethrough; the material of the third deflector 113 may also affect electromagnetic properties of the electron beam. Therefore, it is necessary to properly set the material, specific installation settings (comprising installation position, installation orientation, angle, and the like) and size of the third deflector 113.

In exemplary embodiments of the present disclosure, as illustrated in FIG. 2A, for example, the pole piece 1224 is an end of the inclined portion 1223 of the magnetic yoke 122 disposed substantially parallel to the optical axis O, and a length of each electrode of the third deflector 113 is of the same order of magnitude as a thickness of the pole piece 1224 but is not smaller than and is preferably equal to the thickness of the pole piece 1224. Thereby, the selection of both size of the third deflector 113 (e.g., especially a length thereof along an extension direction in which its electrode extends) and size of the pole piece 1224 (especially the thickness thereof) is essentially computationally obtained by conversion, for a combination of both size of the third deflector 113 and size of the pole piece 1224 which obtains minimized (or approximately minimized) off-axis aberration on the basis of results of a simulation analysis with the electronic optical simulation software MeBS.

Additionally or alternatively, in other exemplary embodiments of the present disclosure, for example, the orientation of electrodes of the third deflector 113 is arranged at a predetermined angle relative to electrodes of the first deflector 111, and the predetermined angle is set such that an off-axis aberration of the electron beam which is subject to deflection applied by the third deflector 113 is minimized. This predetermined angle has an important influence on the imaging effect. Thereby, the selection of the orientation (i.e. predetermined angle) of electrodes of the third deflector 113 relative to electrodes of the first deflector 111 is essentially computationally obtained by conversion, for relative angle setting between the third deflector 113 and the first deflector 111 of the third deflector 113 and size of the pole piece 1224 which obtains minimized (or approximately minimized) off-axis aberration on the basis of results of a simulation analysis with the electronic optical simulation software MeBS.

In embodiments of the present disclosure, for example, it is an option that the third deflector 113 is installed inside the pole piece 1224 of the objective lens assembly, and the third deflector 113 is formed by a non-magnetizer material which is electrically conductive. This does not affect a distribution of the magnetic field of the objective lens assembly 12.

Based on above embodiments, other embodiments having variations and modifications may be implemented.

Figure 3:
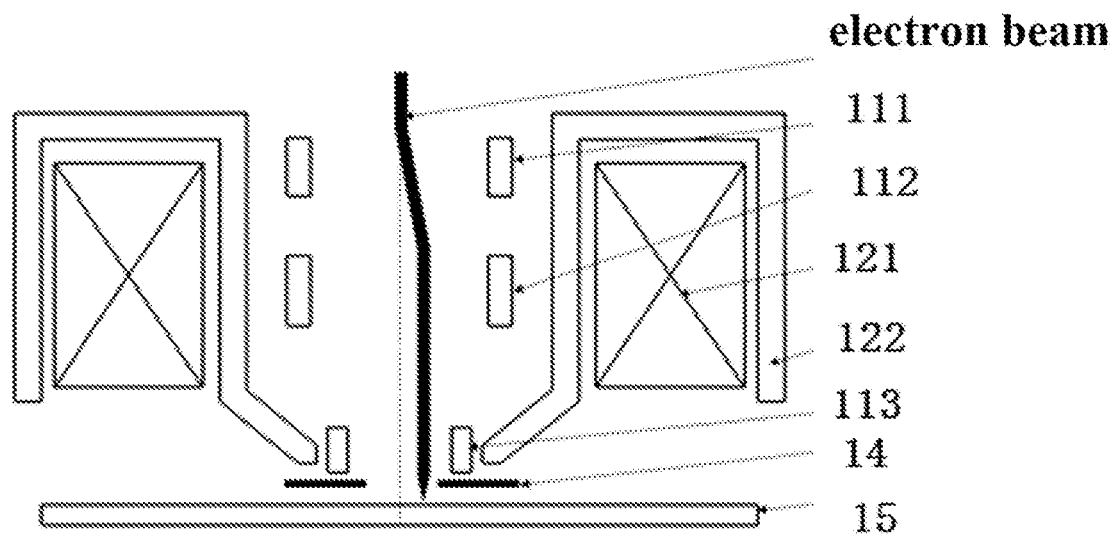
FIG. 3 is a schematic structural view illustrating a scanning electron microscope device according to another embodiment of the present disclosure.

FIG. 3 is a schematic structural view illustrating a scanning electron microscope device according to another embodiment of the present disclosure.

In another embodiment of the present disclosure, as illustrated in FIG. 3, as an extended embodiment based on the embodiments of the present disclosure on the basis of FIGS. 2A to 2B, there is provided a scanning electron microscope device 1, which further comprises, in addition to the above settings, for example, a shielding plate 14, which is provided below the third deflector 113, with an orthographic projection of the third deflector 113 on a plane perpendicular to the optical axis O' completely falling in an orthographic projection of the shielding plate 14 on the plane perpendicular to the optical axis O. With such a setting, an action force applied on electric field by the shielding plate 14 may cover an action range of electric field of the third deflector 113.

In an exemplary embodiment, by way of example, in a condition of a setting of the scanning electron microscope having for example a deceleration mode (specifically but not limited to where, optionally, for example, the pole piece 1224 of the magnetic lens is used as an electrode of an electric lens, and a negative voltage is applied to the sample 15 to be detected, so as to establish the electric lens which in turn forms a deceleration electric field between the sample 15 to be detected and the magnetic lens, such that the electron beam emitted from the electron beam source 10 is decelerated between the magnetic lens and the sample 15 to be detected; or alternatively optionally, the objective lens assembly 12 further comprises a field generator which is arranged between the sample 15 to be detected and the pole piece 1224 of the magnetic lens and configured to provide an electrostatic field therebetween, thereby, by providing the field generator, an electrostatic lens is provided, which operating as a deceleration lens, between the magnetic lens and the surface of the sample 15. Alternatively, there exists none of above two settings for generating deceleration electric field; but instead, there exists a setting having backscattered electron detector and/or secondary electron detector as described hereinafter, and the shielding plate 14 and the aforementioned sample 15, which are at different voltages respectively, so as to generate the deceleration electric field), by way of example, there is a deceleration electric field distributed at the pole piece 1224 of the magnetic lens of the objective lens assembly 12, which will affect the properties of the third deflector 113. With such a setting as above, i.e., the shielding plate 14 is additionally provided below the third deflector 113, for example in a form of a ring-shape plate which is provided with a central opening or a plate having a central opening (for passage of electron beam therethrough), so as to weaken influence of the deceleration electric field applied on the deflection properties of the third deflector 113.

Moreover, in embodiments of the present disclosure, for example, the shielding plate 14 is made by metallic material, with an adjustable voltage applied thereon, and different voltages may be selected depending on different application conditions. When the voltage applied on the shielding plate 14 changes, the excitation of the third deflector 113 is also changed accordingly so as to ensure that the off-axis aberration of the electron beam is minimized.

As an example, the shielding plate 14 is formed by a metallic material, e.g., an alloy material, more specifically, such as an iron nickel alloy or a gold-plated aluminum plate, wherein the iron nickel alloy has magnetoconductivity or magnetic permeability, i.e., magnetizer property, which will affect the magnetic field of the magnetic lens; while the gold-plated aluminum plate is an electrically conductive material having relatively low magnetoconductivity or magnetic permeability and thus functions to shield (i.e., weaken) the deceleration electric field due to its electroconductivity or electrical conductivity, while functions to merely have limited effect of magnetic bypass due to its relatively low magnetoconductivity or magnetic permeability, and thus it is more conducive to the treatment of stray electrons.

FIG. 2A is also a schematic structural view illustrating an exemplary electron beam inspection apparatus 100 comprising the scanning electron microscope device 1 according to embodiments of the present disclosure.

According to the general technical concept of the present disclosure, as illustrated in FIG. 2A, in a second aspect of embodiments of the present disclosure, an electron beam inspection apparatus 100 is provided, comprising: the scanning electron microscope device 1 according to the above embodiment (having the third deflector 113, and optionally the shielding plate 14); a first detector 2 located downstream the sample 15 (for example, between the objective lens assembly 12 and the sample 15 to be detected) and configured to detect backscattered electrons generated by the electron beam incident on the surface of the sample 15; and a second detector 3 located downstream of the sample 15 and configured to detect secondary electrons generated by the electron beam incident on the surface of the sample 15.

By way of example, the first detector 2 operates as a backscattered electron detector, which is for example symmetrically provided on the pole piece 1224 of the magnetic lens of the objective lens assembly 12, on opposite lateral sides in a lateral direction of the electron beam channel 13, and configured to collect the backscattered electron signal generated by an interaction between focused electron beam and the sample 15 to be detected.

In embodiments of the present disclosure, for example, the electron beam inspection apparatus 100 further comprises: a displacement platform module, comprising the following components overlapped with each other or one another: a horizontal displacement platform; a z-direction displacement platform; an electrostatic suction chuck arranged above the z-direction displacement platform and configured to adsorb and hold at an upper surface thereof the sample 15 to be measured; and a position sensing device for sensing the both horizontal and vertical positions of the displacement platform module.

By way of example, the second detector 3 operates as a secondary electron detector, which is for example fixed between the displacement platform module and the pole piece 1224 of the magnetic lens of the objective lens assembly 12, with a grid at a front end of the second detector 3 being applied with a positive bias, thereby it is configured to collect secondary electron signal generated by an interaction between the electron beam and the sample 15 to be detected.

Moreover, in an exemplary embodiment of the present disclosure, for example, in the presence of the shielding plate 14 as above, the first detector and/or the second detector may define alone or cooperatively a composite detection assembly located below the magnetic lens, with different voltages being applied respectively on the composite detection assembly, the shielding plate 14 and the sample 15 to be detected. As such, a decelerating electrostatic lens may be formed thereby, which also generates a decelerating electric field, and the electric field coinciding, to a certain extent (i.e., at least partially), with the magnetic field of the immersed type magnetic lens, such that a composite focusing effect of both the decelerating electric field and the magnetic field will further reduce the aberration of the objective lens assembly 12 and obtain a smaller aberration, as compared with that generated in a condition of purely the immersed type magnetic lens in the absence of the shielding plate 14 (and in turn in the absence of the composite detection assembly). In other words, with individual control (i.e., discrete control) of respective potentials of the composite detection assembly, the shielding plate 14 and the sample 15 to be detected, all of the three jointly and cooperatively define one decelerating electric field of the decelerating electrostatic lens, and then the decelerating electric field cooperates with an immersed type magnetic field generated by the magnetic lens jointly form a composite objective field which is of immersed type for deceleration, which may produce at least three composite effects as follows: firstly, it is capable of focusing the electron beam incident on the sample 15; secondly, it is capable of decelerating the electron beam incident on the sample 15 and reducing the energy of the electron beam so as to reduce its impact on the sample; thirdly, it is capable of accelerating signal electrons (comprising backscattered electrons (BSE) and secondary electrons (SE)) generated on the surface of sample 15 so as to improve collection rate of the signal electrons at the detector(s), and in turn to obtain smaller focused beam spots and to achieve higher resolution.

Moreover, in a further embodiment of the present disclosure, for example, an additional deflection control mechanism is additionally provided between the surface of the sample 15 to be detected and the objective lens assembly 12, more specifically, for example, the deflection control mechanism comprises at least one pair of opposed electrodes and a gap therebetween for passing therethrough the electron beam for scanning. The electrodes of the deflection control mechanism is manufactured by an electrically conductive material having no magnetoconductivity or magnetic permeability, and the deflection control mechanism generates a scanning electric field after a scanning voltage is applied thereon, and the scanning electric field is further coupled with the composite objective field which is of immersed type for deceleration, such that a central axis of the composite objective field which is of immersed type for deceleration of the objective lens assembly 12 swings or translates so as to further reduce the off-axis aberration.

Figure 4:
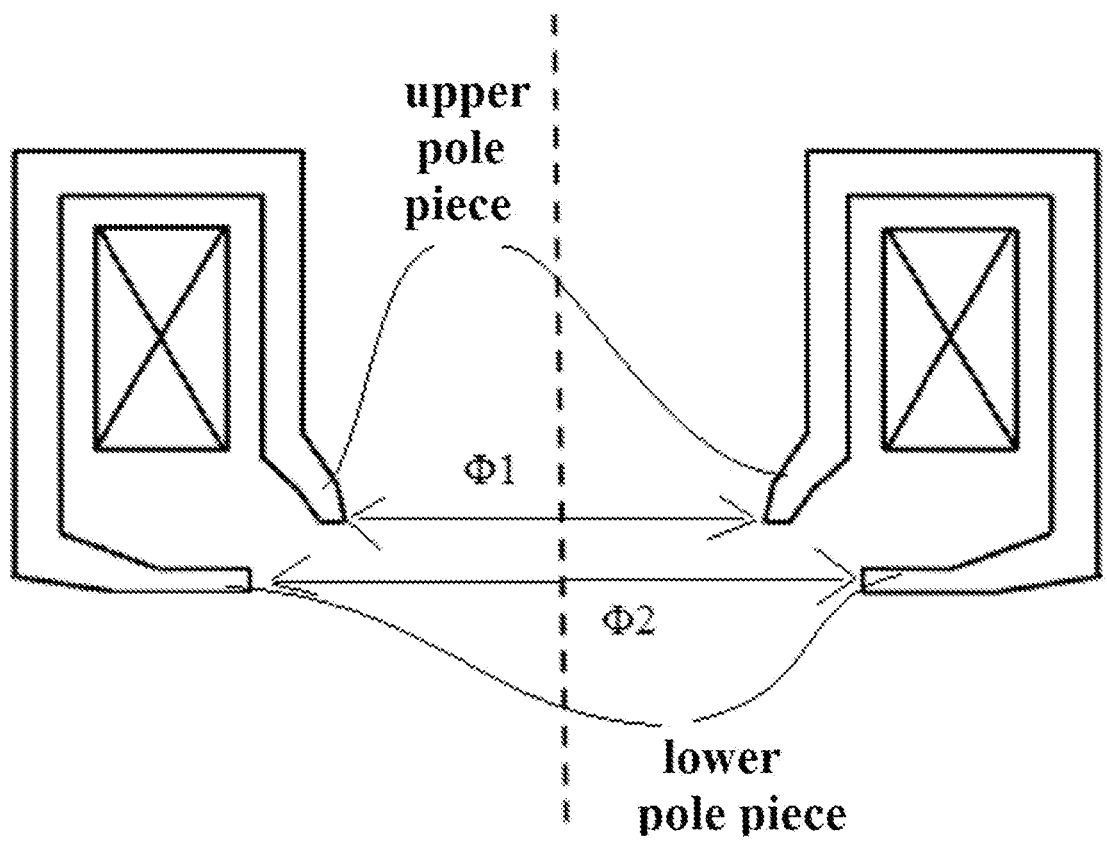
FIG. 4 is a schematic structural view illustrating an objective lens assembly in a scanning electron microscope device according to an alternative embodiment of the present disclosure.

FIG. 4 is a schematic structural view illustrating an objective lens assembly in a scanning electron microscope device according to an alternative embodiment of the present disclosure.

According to an alternative embodiment of the present disclosure, unlike the objective lens assembly which functions as an immersed type magnetic lens having merely a pole piece which is essentially an end of a single inclined portion angled from the radial inner wall of the hollow body of the magnetic yoke towards the optical axis as illustrated in FIG. 2A, FIG. 2B and FIG. 3, the objective lens assembly as illustrated in FIG. 4 is, for example, a semi-immersed type magnetic lens excited by a current coil, or alternatively a non-immersed type magnetic lens. And the objective lens assembly as illustrated in FIG. 4 comprises an magnetic excitation/induction coil (i.e., magnetization coil) wound by a wire and a housing (i.e., a magnetic yoke) formed by a magnetizer material, and the housing has two inclined portions angled towards the optical axis (i.e., two inclined portions, each extending inward from a respective one of radial inner wall and radial outer wall of the housing at respective angle with reference to the respective one of radial inner wall and radial outer wall, respectively, and directing towards the optical axis), and respective ends of the two inclined portions are respectively formed into an upper pole piece and a lower pole piece; and in the direction of the optical axis, the upper pole piece is located above the lower pole piece and positioned closer to the optical axis than the lower pole piece. Moreover, a current excitation in the excitation coil resulting in a formation of a magnetic field between the upper and lower pole pieces. The inner diameter of the upper pole piece is $\Phi 1$ while the inner diameter of the lower pole piece is $\Phi 2$. In a condition of $\Phi 1 \geq \Phi 2$, the magnetic field is concentrated between the upper pole piece and the lower pole piece and thus operates with both of the two pole pieces to function as a non-immersed type magnetic lens; and in a condition of $\Phi 1 \leq \Phi 2$, a portion of resulting magnetic field will leak towards the sample to be detected so as to form a semi-immersed type lens.

The technical solution provided by embodiments of the present disclosure has at least one of the following advantages:

By introducing the third deflector which cooperates with the use of both the first deflector and the second deflector, the off-axis aberration of the electron beam may be reduced and the available field of view (FOV) of scanning images of the electron beam may be expanded, so as to improve detection efficiency of the electron beam. By providing the shielding plate below the third deflector and changing voltage applied on the shielding plate below the third deflector, the influence on performance of the third deflection as applied by the deceleration mode of the objective lens may be weakened so as to ensure the detection efficiency of the electron beam inspection apparatus. Moreover, voltage excitations between the third deflector and each of the first deflector and the second deflector may be proportional; as such, if different voltage ratios are adopted, then resolutions of scanning images of the electron beam may vary. Magnitudes of respective electric excitations of the three deflectors are adjusted depending on different acceleration energies as required by the electron beam inspection apparatus respectively, so as to ensure a maximum available field of view of the image generated by the electron beam.

In addition, according to the foregoing embodiments of the present disclosure, it can be understood that any technical solution formed by any combination of two or more embodiments also falls within the scope of protection of the present disclosure.

It should be understood that, orientation terms in the description of the present disclosure, such as "up", "down", "left", "right", and the like, are used to explain orientation relationship as illustrated in the attached drawings. These orientation terms should not be interpreted as limitation of the scope of protection of the present disclosure.

The embodiments of the present disclosure are described in a progressive manner. Each embodiment focuses on the differences thereof as compared with other embodiments, and the same or similar parts of various embodiments can be referred to each other. In addition, according to the aforementioned embodiments of the present disclosure, it can be understood that any technical solution constructed through a combination of any two or more solutions may also fall within the scope of protection of the present disclosure.

The above are merely preferred embodiments of the invention and are not intended to limit the disclosure. Any modification, equivalent replacement, improvement, and the like made within the spirit and principles of the invention shall be contained in the protection scope of disclosure.

What is claimed is:

1. A scanning electron microscope device for a sample to be detected, which is configured to project an electron beam to a surface of the sample to generate backscattered electrons and secondary electrons, comprising:
   an electron beam source configured to emit along an optical axis thereof the electron beam;
   a deflection mechanism, comprising:
   a first deflector located downstream of the electron beam source; and a second deflector located downstream of the first deflector; and an objective lens assembly, comprising:
- an excitation coil which is energized to create a magnetic field; and
- a magnetic yoke, formed by a magnetizer material as a housing which opens towards the sample, and comprises:
  - a hollow body defining an internal chamber where the excitation coil is accommodated; and
  - at least one inclined portion extending inward from the hollow body at an angle with reference to the hollow body and directing towards the optical axis, with an end of the at least one inclined portion being formed into a pole piece, wherein the deflection mechanism further comprises a third deflector located between the second deflector and the objective lens assembly and disposed in an opening delimited and circumscribed by the pole piece, and each of the first deflector, the second deflector and the third deflector is an electrostatic deflector, and wherein each of the first deflector, the second deflector and the third deflector is in the form of 8-pole or 12-pole electrostatic deflector, and is applied with respective electric excitation which is adjustable so as to adjust both direction and angle of the electron beam passing through the scanning electron microscope device.

2. The scanning electron microscope device according to claim 1, wherein the pole piece is an end of the inclined portion of the magnetic yoke substantially disposed parallel to the optical axis, and a length of each electrode of the third deflector is of the same order of magnitude as a thickness of the pole piece but is not smaller than the thickness of the pole piece.

3. The scanning electron microscope device according to claim 2, wherein the length of each electrode of the third deflector is equal to the thickness of the pole piece.

4. The scanning electron microscope device according to claim 1, wherein the first deflector, the second deflector and the third deflector are arranged coaxially with each other or one another along the optical axis.

5. The scanning electron microscope device according to claim 1, wherein electrodes of the third deflector are arranged at a predetermined angle relative to electrodes of the first deflector, and the predetermined angle is set such that an off-axis aberration of the electron beam which is subject to deflection applied by the third deflector is minimized.

6. The scanning electron microscope device according to claim 1, wherein the third deflector is formed by a non-magnetizer material which is electrically conductive.

7. The scanning electron microscope device according to claim 1, wherein the inclined portion of the objective lens assembly defines an electron beam channel shrinking towards the sample, with a portion of the electron beam channel at the third deflector being a gap defined between the electrodes of the third deflector in a diameter direction thereof.

8. The scanning electron microscope device according to claim 1, further comprising a shielding plate provided below the third deflector, with an orthographic projection of the third deflector on a plane perpendicular to the optical axis completely falling in an orthographic projection of the shielding plate on the plane perpendicular to the optical axis.

9. The scanning electron microscope device according to claim 8, wherein the shielding plate is made by metallic material, with an adjustable voltage applied thereon.

10. An electron beam inspection apparatus, comprising:
- the scanning electron microscope device according to claim 1;
- a first detector located downstream of the sample and configured to detect backscattered electrons generated by the electron beam incident on the surface of the sample; and
- a second detector located downstream of the sample and configured to detect secondary electrons generated by the electron beam incident on the surface of the sample.

11. A scanning electron microscope device for a sample to be detected, which is configured to project an electron beam to a surface of the sample to generate backscattered electrons and secondary electrons, comprising:
- an electron beam source configured to emit along an optical axis thereof the electron beam;
- a deflection mechanism, comprising:
  - a first deflector located downstream of the electron beam source; and
  - a second deflector located downstream of the first deflector; and
- an objective lens assembly, comprising:
  - an excitation coil which is energized to create a magnetic field; and
  - a magnetic yoke, formed by a magnetizer material as a housing which opens towards the sample, and comprises:
    - a hollow body defining an internal chamber where the excitation coil is accommodated; and
    - at least one inclined portion extending inward from the hollow body at an angle with reference to the hollow body and directing towards the optical axis, with an end of the at least one inclined portion being formed into a pole piece, wherein the deflection mechanism further comprises a third deflector located between the second deflector and the objective lens assembly and disposed in an opening delimited and circumscribed by the pole piece, and each of the first deflector, the second deflector and the third deflector is an electrostatic deflector, and wherein the scanning electron microscope device further comprises a shielding plate provided below the third deflector, with an orthographic projection of the third deflector on a plane perpendicular to the optical axis completely falling in an orthographic projection of the shielding plate on the plane perpendicular to the optical axis.

12. The scanning electron microscope device according to claim 11, wherein the shielding plate is made by metallic material, with an adjustable voltage applied thereon.

13. The scanning electron microscope device according to claim 11, wherein each of the first deflector, the second deflector and the third deflector comprises a pair of electrodes provided opposite to each other and symmetrically relative to the optical axis, and is applied with respective electric excitation which is adjustable so as to adjust both direction and angle of the electron beam passing through the scanning electron microscope device.

14. The scanning electron microscope device according to claim 11, wherein the first deflector, the second deflector and the third deflector are arranged coaxially with each other or one another along the optical axis.

15. The scanning electron microscope device according to claim 11, wherein the third deflector is formed by a non-magnetizer material which is electrically conductive.

16. The scanning electron microscope device according to claim 11, wherein the inclined portion of the objective lens assembly defines an electron beam channel shrinking towards the sample, with a portion of the electron beam channel at the third deflector being a gap defined between the electrodes of the third deflector in a diameter direction thereof.

* * * * *